United States Patent
Pohl et al.

(10) Patent No.: US 7,993,969 B2
(45) Date of Patent: Aug. 9, 2011

(54) METHOD FOR PRODUCING A MODULE WITH COMPONENTS STACKED ONE ABOVE ANOTHER

(75) Inventors: Jens Pohl, Bernhardswald (DE); Michael Bauer, Nittendorf (DE)

(73) Assignee: Infineon Technologies AG, Munich (DE)

( * ) Notice: Subject to any disclaimer, the term of this patent is extended or adjusted under 35 U.S.C. 154(b) by 739 days.

(21) Appl. No.: 11/463,799

(22) Filed: Aug. 10, 2006

(65) Prior Publication Data

US 2008/0036059 A1 Feb. 14, 2008

(51) Int. Cl.
- *H01L 25/10* (2006.01)
- *H01L 23/40* (2006.01)
- *H01L 23/488* (2006.01)
- *B65B 35/50* (2006.01)

(52) U.S. Cl. . 438/108; 257/786; 257/777; 257/E21.499; 438/109

(58) Field of Classification Search ........... 257/E21.499, 257/686, 777; 438/108, 109
See application file for complete search history.

(56) References Cited

U.S. PATENT DOCUMENTS

| | | | |
|---|---|---|---|
| 4,565,314 A * | 1/1986 | Scholz | 228/180.21 |
| 5,523,628 A | 6/1996 | Williams et al. | |
| 5,633,535 A | 5/1997 | Chao et al. | |
| 5,757,999 A * | 5/1998 | Tabuchi et al. | 385/93 |
| 5,883,426 A * | 3/1999 | Tokuno et al. | 257/686 |
| 6,046,910 A * | 4/2000 | Ghaem et al. | 361/760 |
| 6,650,019 B2 * | 11/2003 | Glenn et al. | 257/777 |
| 6,982,521 B2 * | 1/2006 | Rodriguez et al. | 313/495 |
| 7,019,408 B2 | 3/2006 | Bolken et al. | |
| 2003/0146518 A1 * | 8/2003 | Hikita et al. | 257/777 |
| 2005/0051903 A1 * | 3/2005 | Ellsberry et al. | 257/777 |
| 2005/0239276 A1 * | 10/2005 | Isobe | 438/612 |
| 2005/0258545 A1 * | 11/2005 | Kwon | 257/777 |
| 2007/0181992 A1 * | 8/2007 | Lake | 257/698 |

FOREIGN PATENT DOCUMENTS

| | | |
|---|---|---|
| DE | 103 03 588 | 8/2004 |
| DE | 102004002163 | 8/2005 |
| WO | 95/20820 | 8/1995 |
| WO | 96/37913 | 11/1996 |
| WO | 2005/117111 | 12/2005 |

OTHER PUBLICATIONS

"Package on Package (PoP)" by Amkor Technology Inc. (Packaging Subcontractor)—presented in Jan. 2006.
"ASE Proposal: Ball on Ball Stacking in Package on Package (PoP)"—presented on a JEDEC conference, Mar. 2006.

* cited by examiner

*Primary Examiner* — Eugene Lee
*Assistant Examiner* — Peniel M Gumedzoe
(74) *Attorney, Agent, or Firm* — Patterson & Sheridan, LLP

(57) ABSTRACT

The invention relates to a method in which components (101, 102) are provided, movement elements (104) are in each case applied to surfaces of a number of the components (101), and the components (101, 102) are stacked, so that one or a plurality of the movement elements (104) are situated between adjacent components (101, 102) and the components (101, 102) are held in their position by connecting elements (103).

14 Claims, 4 Drawing Sheets ca. 400μm ca. 600μm

METHOD FOR PRODUCING A MODULE WITH COMPONENTS STACKED ONE ABOVE ANOTHER

The invention relates to a method which serves for stacking components each comprising one or a plurality of semiconductor chips, in particular, one above another. Furthermore, the invention relates to a module, in particular a semiconductor module, with components stacked one above another.

In order to attain semiconductor modules that are as compact as possible, components can be stacked one above another. This stacking may be effected at the chip level by stacking semiconductor chips one above another. It is also possible for the individual semiconductor chips firstly to be integrated into packages and then for the packages to be stacked one above another.

In accordance with one aspect, the method serves for producing components stacked one above another. For this purpose, a plurality of components are provided. One or a plurality of movement elements are applied to in each case at least one surface of a number of the components. The components are stacked one above another in such a way that in each case one or a plurality of the movement elements are situated between two adjacent components. The components are held in their position one below another by means of connecting elements.

In accordance with a further aspect, in the method, firstly a first component and a second component are provided. The first component has a top side with first contact elements. The second component has an underside with second contact elements. Rollable elements are applied to the top side of the first component or to the underside of the second component. The second component is arranged above the first component and soldering connections are produced between the first contact elements and the second contact elements.

The invention is explained in more detail below in exemplary fashion with reference to the drawings, in which.

Methods for producing components stacked one above another are described below. The invention is independent of the type of component. Components may be any type of components which can be stacked, which are warped on account of temperature fluctuations during production or use and/or which are intended to be electrically connected to one another. In particular, the components may be electrical, electromechanical and/or electro-optical components, e.g. integrated circuits, sensors, microelectromechanical components (MEMs), laser diodes, etc. The components may be produced on a semiconductor basis or be constructed on some other substrate, e.g. ceramic substrate, glass substrate, polymer or PCB. They may be packaged or unpackaged.

In the method, one or a plurality of movement elements are applied to the in each case at least one surface of the components. Movement elements may be e.g. mechanical or chemical elements which enable or facilitate a movement between two adjacent components. Mechanical movement elements may e.g. be shaped such that they can roll or slide between the two adjacent surfaces.

During the application of the movement elements to the in each case at least one surface of the components, the movement elements may be suspended, e.g. in a carrier substance. The invention is independent of the chemical composition of the carrier substance. The carrier substance may be present e.g. with liquid, viscous or waxy consistency during application to the in each case at least one surface of the components. The carrier substance may be chosen e.g. such that it evaporates or sublimates after application, e.g. during a soldering operation.

In the method, the components are held in their position one below another by means of connecting elements. The connecting elements may be produced from a conductive material, e.g. from metal. It is possible to produce electronic connections between adjacent components in this way. The connecting elements may be rigid bodies; by way of example, they may be configured in pillar-like fashion. In this way, the two components can be held in a rigid position with respect to one another.

The connecting elements may be produced by means of a soldering operation. A wire bonding method may be used, by way of example. Solder deposits may also be situated on the components. In this case, the solder deposits may be situated e.g. on one of two components to be connected, or solder deposits may be situated on both components, which solder deposits e.g. lie opposite one another and jointly form a soldering connection during the soldering operation.

Figure 1A:
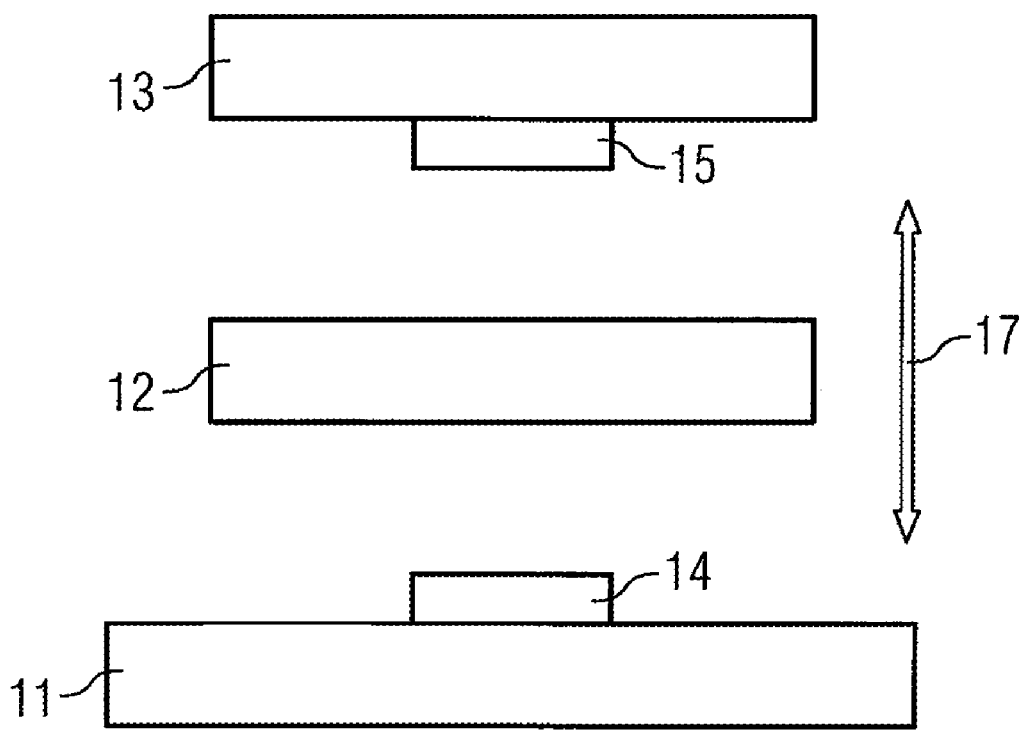
FIGS. 1A and 1B show schematic representations for illustrating a method for producing a module as a first exemplary embodiment of the invention.
Figure 1B:
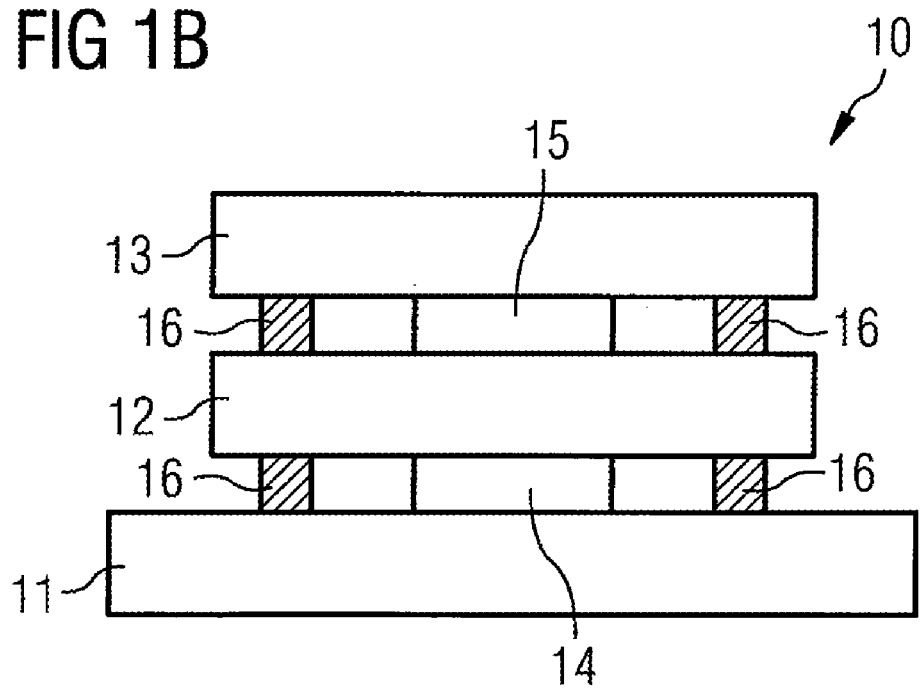

FIGS. 1A and 1B show a method for producing a module 10 as a first exemplary embodiment of the invention. The module 10 produced by the method is schematically represented in a side view in FIG. 1B and comprises a plurality of components 11, 12 and 13. The number of components 11, 12 and 13 is three, by way of example, in the first exemplary embodiment. However, the module 10 may also comprise 2, 4, 5 or even more components. Movement elements 14 and 15 are situated between in each case two adjacent components 11, 12 and 13. The components 11, 12 and 13 are held in position one below another by means of connecting elements 16.

In order to produce the module 10, firstly the components 11, 12 and 13 are provided, said components comprising for example semiconductor chips, in particular packaged semiconductor chips. The movement elements 14 and 15 are applied to one surface of a number of the components 11, 12 and 13. By way of example, FIG. 1A shows that the movement element 14 is applied to the top side of the component 11, while the movement element 15 is applied to the underside of the component 13. As shown in FIG. 1A, the components 11, 12 and 13 are stacked one above another along a stacking direction 17 in such a way that the movement elements 14 and 15 are situated between the adjacent components 11 and 12, and 12 and 13, respectively.

The connecting elements 16 are situated in each case in the interspaces between the components 11, 12 and 13 in FIG. 1B. This is not to be understood as restrictive; the connecting elements 16 can also be arranged outside said interspaces and hold the components 11, 12 and 13 in position.

The module 10 and the method for producing the module 10 may have the configurations or a selection of the configurations which are explained below in connection with the second exemplary embodiment of the invention.

Figure 2A:
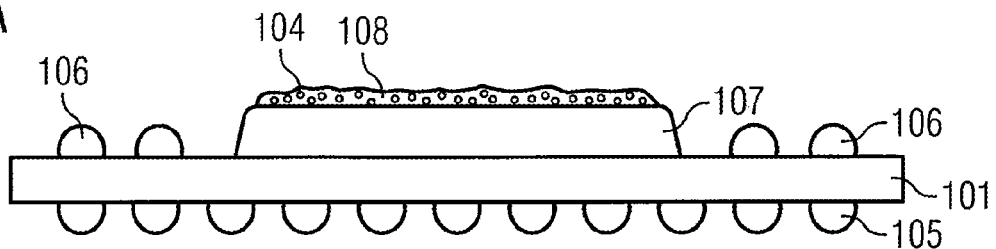
FIGS. 2A to 2D show schematic representations for illustrating a method for producing a semiconductor module as a second exemplary embodiment of the invention.
Figure 2B:
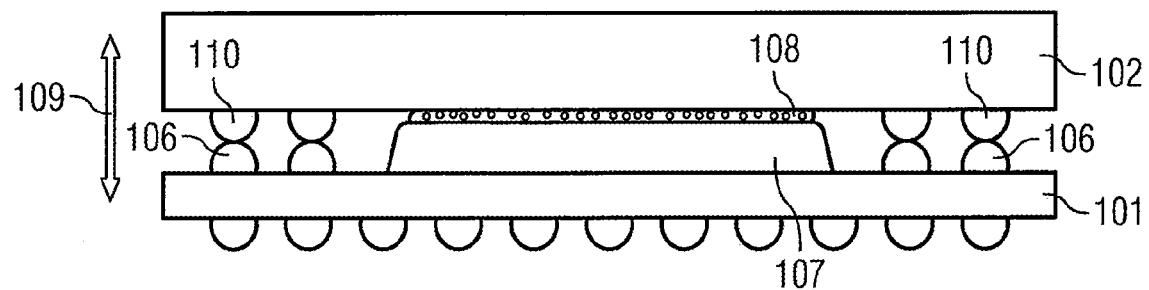
Figure 2C:
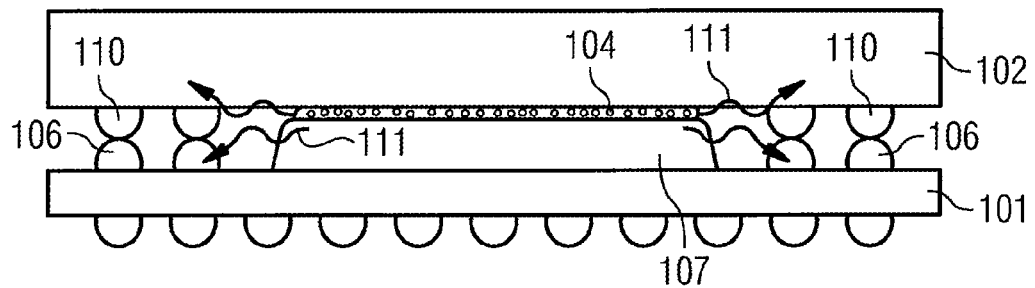
Figure 2D:
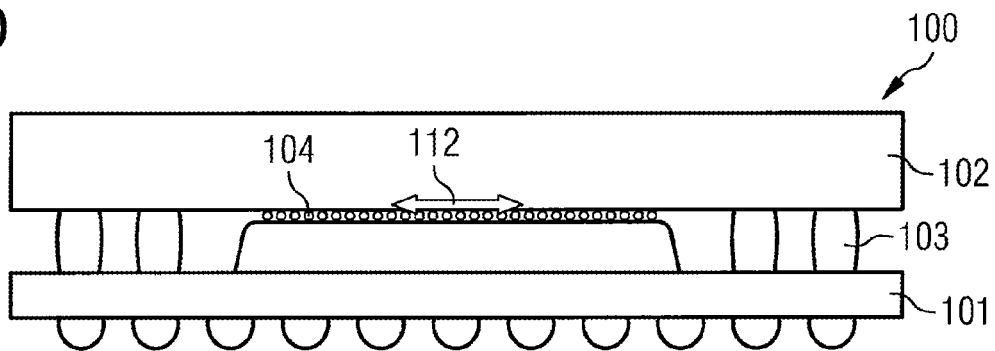

FIGS. 2A to 2D show a method for producing a semiconductor module 100 as a second exemplary embodiment of the invention. The semiconductor module 100 produced by the method is represented schematically in FIG. 2D. The semiconductor module 100 comprises a base component 101 and a top component 102. The top component 102 is arranged on the base component 101. Both the base component 101 and the top component 102 each comprise a package, for example, into which one or a plurality of semiconductor chips are integrated. The outer forms of the base component 101 and of the top component 102, as are represented in side view in FIG. 2D, are determined by the outer forms of the respective packages. The packages are produced by encapsulating the semiconductor chips with an encapsulant, for example a plastic, by injection moulding. The base component 101 and the top component 102 are electrically and mechanically connected to one another by means of solder pillars 103. Furthermore, balls 104 are situated between the base component 101 and the top component 102. The balls 104 serve as movement elements, as will be explained further below.

In order to produce the semiconductor module 100, firstly the base component 101, as is shown in FIG. 2A, is provided. The base component 101 has contact areas equipped with solder balls 105 on its underside. Pins may also be provided instead of the solder balls 105. Further contact areas to which solder balls 106 have been applied are arranged in the edge region of the top side of the base component 101. The contact areas provided with the solder balls 105 and 106 are electrically connected to the semiconductor chip(s) embedded in the base component 101 and serve for making electrical contact with the semiconductor chips.

A cap 107 is formed in the central region of the top side of the base component 101. The cap 107 may comprise the encapsulant at its top side, by way of example. In an alternative configuration, the top side of the cap 107 may be the underside of a semiconductor chip that has been incorporated into the base component 101 by means of flip-chip technology. The cap 107 has the effect of elevating the central region of the top side of the base component 101 relative to the edge region on which the solder balls 106 are situated.

Before the top component 102 is stacked onto the base component 101, a suspension 108 is applied to the top side of the cap 107. In an alternative configuration, the suspension 108 is applied to the underside of the top component 102. The suspension 108 comprises a viscous or waxy carrier substance in which the balls 104 are suspended.

The carrier substance has the task of enabling the balls 104 to be applied to the top side of the cap 107 or the underside of the top component 102. Therefore, the carrier substance should be chosen such that it is viscous or waxy during application to the base component 101 or the underside of the top component 102, that is to say e.g. at a temperature within the range of approximately 18 to 26° C. Such a consistency of the suspension 108 firstly enables simple application and secondly prevents the suspension 108 from flowing from the cap 107 or the underside of the top component 102. Furthermore, when selecting the carrier substance for the suspension 108, it should be taken into consideration that—as will be explained further below—the carrier substance must evaporate or sublimate without any residues during the soldering operation that is to be carried out later.

One substance that meets the abovementioned requirements made of the carrier substance of the suspension 108 is benzoic acid in tertiary butanol, for example. Tertiary butanol melts at a temperature of 25° C. and is waxy at lower temperatures. Furthermore, tertiary butanol evaporates relatively rapidly on account of its high vapour pressure. Benzoic acid sublimates without any residues at a temperature of approximately 120° C. Since the OH groups of benzoic acid adhere both to the balls 104 and to the plastic of the package of the base component 101, benzoic acid imparts adhesion of the balls 104 to the cap 107 until its sublimation.

Caffeine, naphthalene or phthalic anhydride, by way of example, are furthermore appropriate as the carrier substance of the suspension 108, the substances mentioned being dissolved for example in higher alcohols (starting from butanol), higher alkanes (starting from decane) or dihydric alcohols.

As an alternative to the use of the suspension 108, it would also be conceivable, for example, for the balls 104 not to be suspended in a carrier substance, but rather to be applied directly, that is to say in a non-suspended state, to the top side of the cap 107 or the underside of the top component 102. In this case, however, it must be ensured that the balls 104 adhere sufficiently well to the surface of the cap 107 or the underside of the top component 102 in order that they do not roll from the cap 107 or become detached from the underside of the top component 102 before the top component 102 is applied to the base component 101 and before the soldering operation. This can be achieved for example by electrostatically charging the balls 104. In this case, the charge of the balls 104 must have an opposite sign to the charge of the surface of the cap 107 or the underside of the top component 102 or induce such a charge in the surface of the cap 107 or the underside of the top component 102. Electrostatic charging of the balls 104 can be achieved for example by means of suitably chosen surface groups. Electrostatic charging of the balls 104 furthermore brings about mutual repulsion of the balls 104 on account of the same charge sign, the consequence of which is that the balls 104 are distributed uniformly on the top side of the cap 107 or the underside of the top component 102. Furthermore, it is possible to achieve adhesion of the balls 104 on the cap 107 or the underside of the top component 102 by means of chemical bonds. For this purpose, the balls 104 are for example coated in a suitable manner or the material of the balls 104 is chosen such that the surfaces of the balls 104 have groups which form bonds with surface groups of the cap 107 or the underside of the top component 102, which bonds are strong enough to prevent the balls 104 from rolling away or dropping off.

In a further method step illustrated in FIG. 2B, the top component 102 is stacked onto the base component 101 along a stacking direction 109. The top component 102 has contact areas equipped with solder balls 110 at its underside. The contact areas are electrically connected to the semiconductor chip(s) embedded in the package of the top component 102. The contact areas and the solder balls 110 are arranged in the edge region of the underside of the top component 102 in such a way that they lie opposite the solder balls 106 of the base component 101 when the top component 102 is placed onto the base component 101.

After the top component 102 has been placed onto the base component, soldering connections are produced from the solder balls 106 and 110 lying opposite one another. FIG. 2C illustrates by means of arrows 111 that the carrier substance in which the balls 104 are suspended evaporates or sublimates without any residues in the course of heating during the soldering operation and only the balls 104 remain between the top side of the cap 107 and the underside of the top component 102. As a result of the heating, furthermore, the solder balls 106 and 110 melt and solder balls 106 and 110 lying opposite one another in each case form solder pillars 103, as are shown in FIG. 2D.

If the top component 102 rested with the solder balls 110 on the solder balls 106 of the base component 101 prior to the soldering operation, the top component 102 subsides as the solder balls 106 and 110 melt and in the process presses the balls 104 against the top side of the cap 107 with the central region of its underside. Between the cap 107 and the top component 102, the balls 104 then generally only lie one beside another and no longer one above another.

During the period of time during which the solder of the solder pillars 103 is liquid, the balls 104 act like a kind of ball bearing between the cap 107 and the underside of the top component 102. The balls 104 enable the top component 102 to move on the base component 101 during this time, to be precise in a direction perpendicular to the stacking direction 109. These degrees of freedom are illustrated by arrows 112 in FIG. 2D. What is advantageous about this freedom of movement is that the top component 102 can "float" into the correct position in which the solder pillars 103 have been oriented substantially parallel to the stacking direction 109.

If the balls 104 are produced from an elastic material, they are accorded a further function besides the function as "ball bearing". As the solder pillars 103 cool down and solidify, a tensile stress arises in the solder pillars 103 as a result of thermal shrinkage along the stacking direction 109. Since the balls 104 can absorb a portion of the stresses on account of their elasticity, they reduce the mechanical stresses caused by the thermal shrinkage in the solder pillars 103 and the contact areas connected to the solder pillars 103.

Furthermore, the balls 104 are advantageous in so far as they produce a spatial distance between the base component 101 and the top component 102 which is filled with air, for example. Said distance brings about a thermal insulation of the two components 101, 102. In the case where the semiconductor module 100 is implemented in mobile applications such as, for example, in mobile telephones, PDAs or navigation systems, the base component 101 comprises a logic chip, for example, and the top component 102 comprises memory elements, such as flash, SRAM or DRAM memory elements, for example. During operation, the temperature of the logic chip typically exceeds the maximum temperature permitted for the memory elements. The air gap produced by the balls 104 brings about a thermal insulation of the memory elements from the logic chip, thereby preventing the memory elements from being heated by the logic chip.

Examples of appropriate materials for the balls 104 are butadiene, silicone or EPDM (ethylene propylene diene rubber). The aforementioned materials have sufficient elasticity for the specified purposes. The diameter of the solder balls 104 lies within the range of 40 to 80 μm, for example, and is 50 μm, for example.

The advantages associated with the use of the balls 104 in the production of the semiconductor module 100 shown in FIG. 2D are illustrated once again below on the basis of a method represented in FIG. 3.

The method represented in FIG. 3 serves in the same way as the method shown in FIG. 2 for the production of a semiconductor module 200, in which a top component 202 is arranged on a base component 201. In contrast to the method shown in FIG. 2, the method represented in FIG. 3 dispenses with balls between the base component 201 and the top component 202.

Figure 3A:
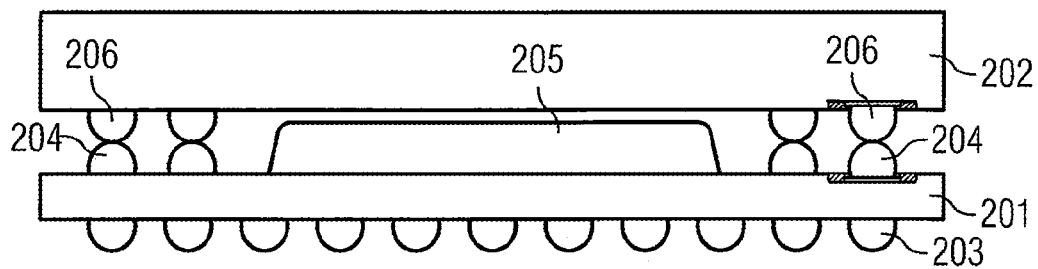
FIGS. 3A to 3C show schematic representations for illustrating a further method for producing a semiconductor module.
Figure 3B:
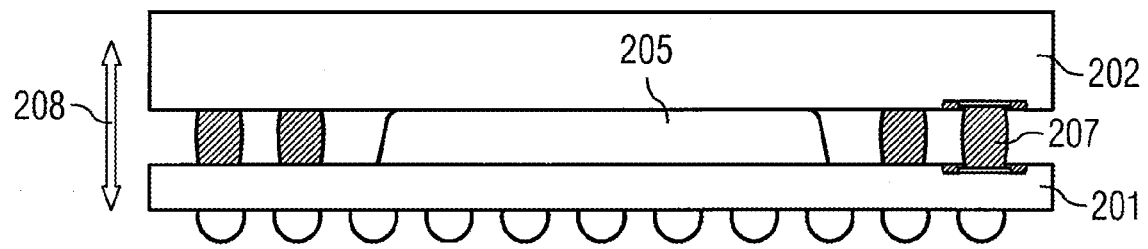

FIG. 3A shows that the base component 201 has contact areas equipped with solder balls 203 on its underside. Contact areas equipped with solder balls 204 are arranged in the edge region of the top side of the base component 201 and a cap 205 is formed in the centre of the top side of the base component 201. The top component 202 has contact areas provided with solder balls 206 at its underside in the edge region. The contact areas equipped with the solder balls 204 and 206 are arranged in such a way that two solder balls 204 and 206 in each case lie opposite one another when the top component 202 is placed onto the base component 201.

During the soldering operation, the solder balls 204 and 206 are melted and solder balls 204 and 206 lying opposite one another in each case form a solder pillar 207. In contrast to the method shown in FIG. 2, the top component 202 subsides with its underside right onto the top side of the cap 205 of the base component 201 as soon as the solder balls 204 and 206 melt (cf. FIG. 3B). As a result, the top component 202 is fixed in its position and "floating" of the solder pillars 207 into the correct position is prevented.

Figure 3C:
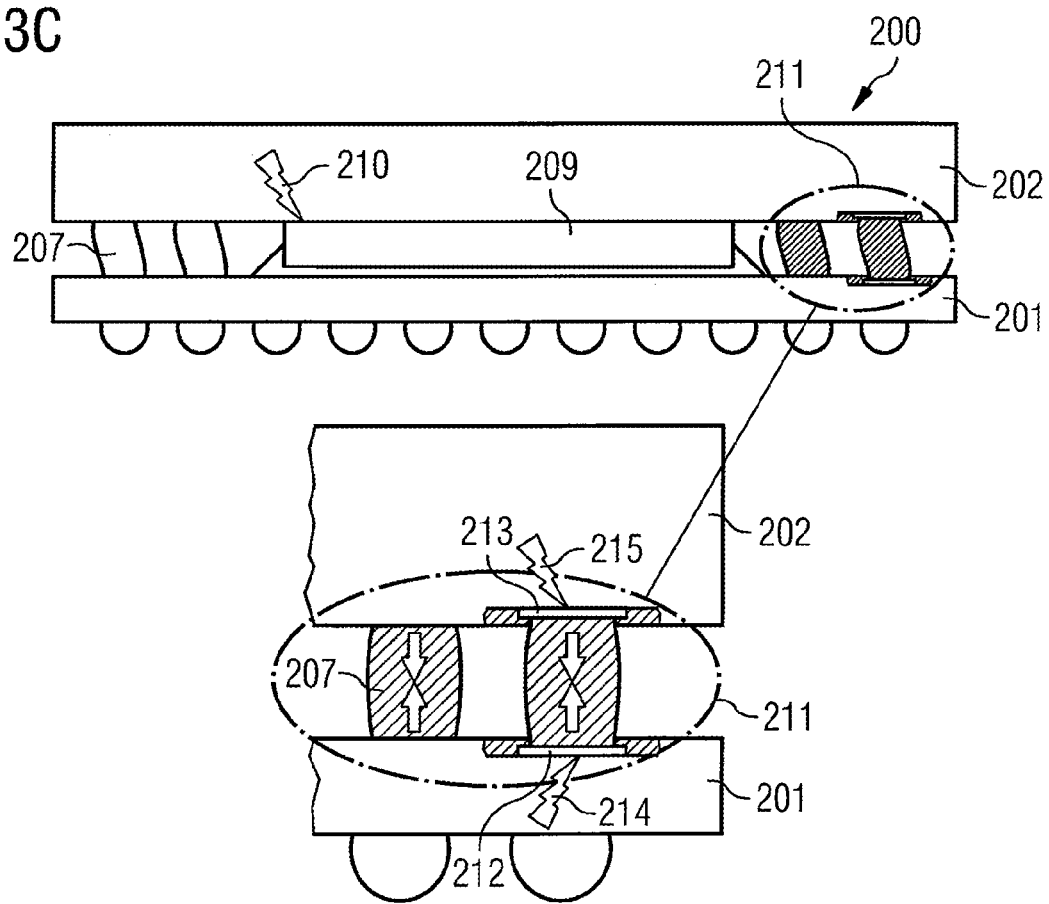

The lack of mobility during the soldering operation may lead to soldering faults, for example in the form of interrupted soldering contacts or short circuits. Furthermore, the absence of a possibility for "floating" of the solder pillars 207 may ultimately lead to solder pillars 207 which are not oriented perpendicular to the underside of the top component 202 and the top side of the base component 201 or parallel to the stacking direction 208. Such skew solder pillars 207 are shown in FIG. 3C. Skew solder pillars 207 may have a lower mechanical stability than straight solder pillars 207, which may ultimately lead to the solder pillars 207 breaking up and to functional failures and short circuits.

A further disadvantage associated with the omission of the balls between the base component 201 and the top component 202 is brought about by the fact that the solder pillars 207 cause a tensile stress along the stacking direction 208 as they solidify on account of thermal shrinkage. If the base component 201—as is shown in FIG. 3C—is equipped with a semiconductor chip 209 in flip-chip technology, an edge compression may arise at the semiconductor chip 209 on account of the tensile stress of the solidified solder pillars 207 (cf. lightning flash 210 in FIG. 3C). The edge compression may cause silicon material to splinter off from the semiconductor chip 209 and may possibly entail a functional failure of the semiconductor chip 209.

The tensile stress in the solidified solder pillars 207 may furthermore cause peel stresses in the contact areas via which the solder pillars 207 are connected to the base component 201 and the top component 202. Said peel stresses are illustrated in the lower part of FIG. 3C, in which a partial region 211 of the semiconductor module 200 is represented in enlarged fashion. The peel stresses on contact areas 212 and 213 are illustrated by lightning flashes 214 and 215. The peel stresses may cause the contact areas 212 and 213 to be prematurely torn out.

In the second exemplary embodiment of the invention as shown in FIG. 2, each of the solder pillars 103 is produced from two solder balls 106 and 110 lying opposite one another. As an alternative to this configuration, it may also be provided that only the top side of the base component 101 or only the underside of the top component 102 is equipped with solder balls and that soldering connections are accordingly produced from only one solder ball in each case. However, the method for producing the solder pillars 103 as shown in FIG. 2 affords the advantage over this alternative configuration that the solder pillars 103 have a significantly smaller diameter despite their comparatively large height. This enables a smaller distance between the solder pillars 103 and thus a higher density of the contact areas.

The height of the solder pillars 103 is determined by the height difference between the top side of the cap 107 and the edge region of the top side of the base component 101 and also by the diameter of the balls 104. The cap 107 and the balls 104 form a spacer that prevents solder balls 106 and 110 lying opposite one another from melting to form a common large solder ball.

Figure 4A:
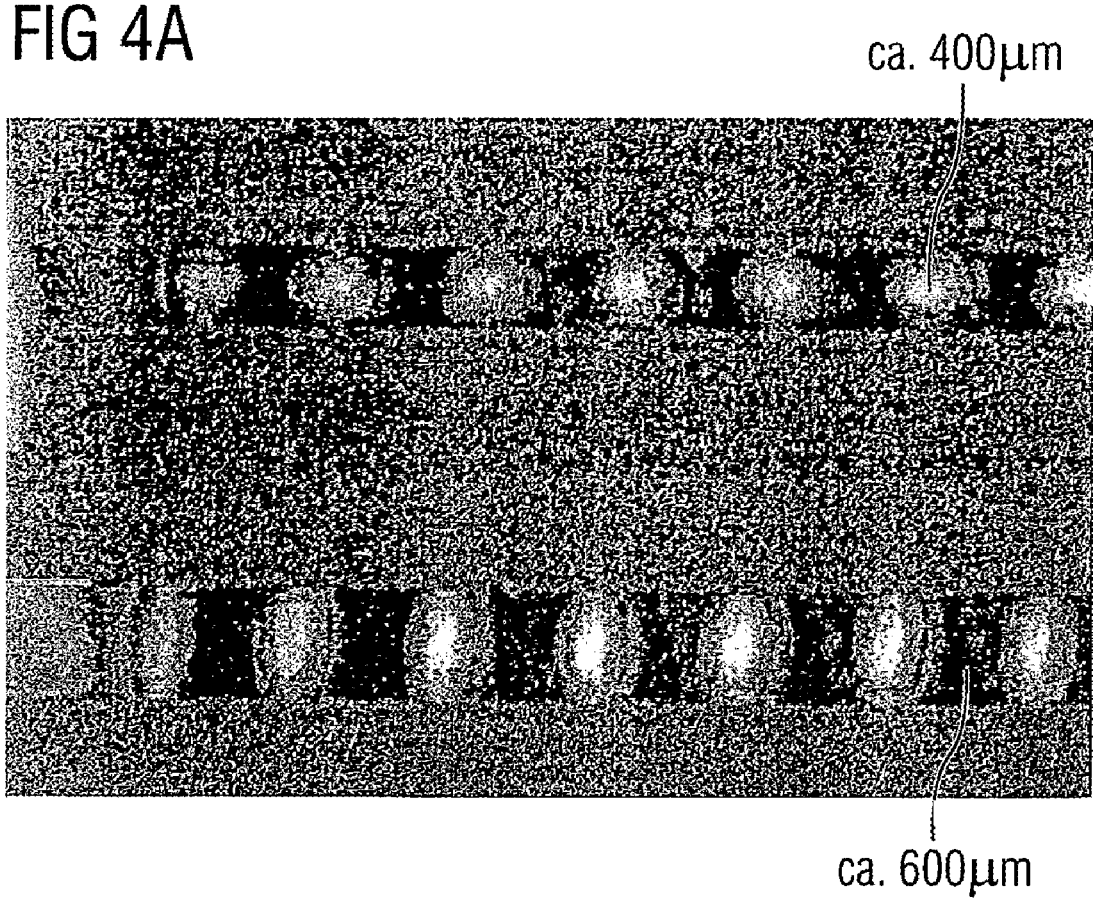
FIGS. 4A and 4B show light microscope micrographs of semiconductor modules.
Figure 4B:
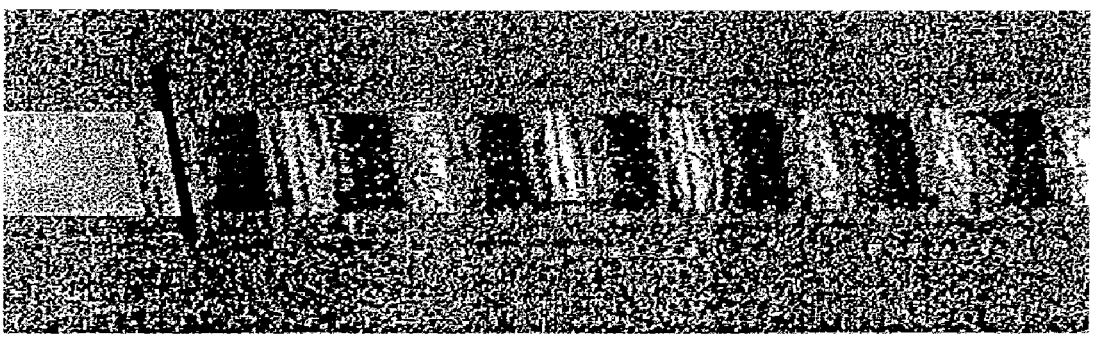
Figure 4B:
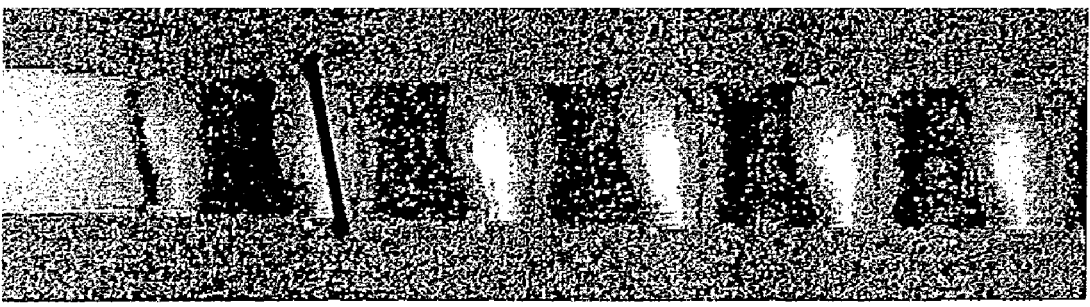

FIG. 4A shows light microscope micrographs of solder pillars. The cap of the base component has a height of 400 μm in the upper micrograph and a height of 600 μm in the lower micrograph. Identical base and top components were used for both micrographs. FIG. 4B shows light microscope micrographs of skew solder pillars. The skew solder pillars were caused by the top component subsiding directly onto the cap of the base component during the soldering operation.

In the second exemplary embodiment of the invention as shown in FIG. 2, before the top component is placed onto the base component, elastic balls are applied to the cap of the base component or the underside of the top component. The balls serve firstly to enable a displacement of the top component on the base component during the soldering operation, and secondly the balls reduce mechanical stresses in the solder pillars and the contact areas on account of their elasticity. For these purposes, however, it is not necessarily the case that elements which have an ideal spherical form have to be introduced between the base component and the top component. Bodies having the form of, for example, an ellipsoid of revolution or a cylinder may also have sufficient rolling properties to ensure a certain freedom of movement of the top component in a direction perpendicular to the stacking direction. As an alternative to substantially spherical or rollable bodies, it is also conceivable to apply substantially parallelepipedal laminae to the cap of the base component or the underside of the top component, in which case the laminae would have to be produced from a sufficiently soft material, so that a mobility of the top component would be ensured to a certain extent by means of a tilting or torsion of the soft laminae.

As a further alternative to the second exemplary embodiment represented in FIG. 2, it is furthermore possible for further components to be stacked over the top component represented in FIG. 2 with application of the method according to the invention.

The invention claimed is:

1. A method, comprising:
   providing a first component having a top side with first contact elements;
   providing a second component having an underside with second contact elements;
   applying one or more movement elements to at least one of the top side of the first component and the underside of the second component, wherein the movement elements are suspended in a carrier substance;
   stacking the components on one another, so that the movement elements are disposed between the two components; and
   soldering connections between the first contact elements and the second contact elements, wherein, before the soldering, the first contact elements are in touch with the second contact elements and at least one of the movement elements is not in direct contact with both of the first component and the second component, and wherein the carrier substance evaporates without residue during the soldering.

2. The method according to claim 1, wherein the movement elements are compressible at least along a direction in which the components are stacked.

3. The method according to claim 1, wherein the movement elements are substantially spherical.

4. A method, comprising:
   providing a plurality of components;
   applying one or more movement elements to at least one surface of each of a number of the components; wherein the movement elements are suspended in at least one of a viscous and waxy carrier substance during application to the respective surfaces of the number of components; and
   stacking the plurality of components on one another, so that the movement elements are disposed between two adjacent components of the plurality of components, wherein a second component of the plurality of components is adjacent to a first component of the plurality of components, wherein an underside of the second component is over a top side of the first component, wherein the viscous or waxy carrier substance is applied to an underside of the second component, wherein the plurality of components are held in their respective positions relative to one another by connecting elements, wherein the movement elements are configured to allow a degree of relative movement between the two adjacent components, and wherein the carrier substance is configured to evaporate or sublimate without any residue during a production of the connecting elements.

5. The method according to claim 1, wherein the movement elements are situated in a manner free of adhesive between the components after production of the connecting elements.

6. The method according to claim 1, further comprising applying solder deposits on the components, and wherein, during the stacking of the components, the components are oriented in such a way that a solder deposit of one component lies opposite a solder deposit of an adjacent component.

7. The method according to claim 1, wherein the components comprise a packaged semiconductor chip.

8. The method according to claim 1, wherein the degree of relative movement is substantially perpendicular to a direction in which the components are stacked.

9. A method, comprising:
   providing a first component having a top side with first contact elements, wherein a cap defined by a semiconductor chip is disposed on the top side of the first component;
   providing a second component having an underside with second contact elements;
   applying rollable elements to at least one of a surface of the cap and the underside of the second component, wherein the rollable elements are not suspended in a carrier substance but adhere to the surface of the cap or to the underside of the second component by means of chemical bonds or by means of electrostatic charge, and wherein the rollable elements are substantially spherical;
   positioning the second component on the first component to form a stacked arrangement of the first and second component; and
   soldering connections between the first contact elements and the second contact elements; wherein, during the soldering, the rollable elements allow a degree of relative movement between the first component and the second component.

10. The method according to claim 9, wherein the rollable elements are elastic.

11. The method according to claim 9, wherein the first and second contact elements have solder deposits, and the second component are oriented above the first component in such a way that a solder deposit of a first contact element lies opposite a solder deposit of a second contact element.

12. The method according to claim 9, wherein the rollable elements are situated in a manner free of adhesive between the first and second components after a production of the soldering connections.

13. The method according to claim 9, wherein at least one of the first component and the second component comprises a packaged semiconductor chip.

14. The method according to claim 4, wherein the connecting elements are soldering connections.

* * * * *